(12) United States Patent
Sakai et al.

(10) Patent No.: US 11,811,427 B2
(45) Date of Patent: Nov. 7, 2023

(54) INFORMATION PROCESSING APPARATUS, METHOD OF PROCESSING INFORMATION, AND NON-TRANSITORY COMPUTER-READABLE STORAGE MEDIUM FOR STORING INFORMATION PROCESSING PROGRAM

(71) Applicant: FUJITSU LIMITED, Kawasaki (JP)

(72) Inventors: Yasufumi Sakai, Fuchu (JP); Sosaku Moriki, Fukuoka (JP)

(73) Assignee: FUJITSU LIMITED, Kawasaki (JP)

( * ) Notice: Subject to any disclaimer, the term of this patent is extended or adjusted under 35 U.S.C. 154(b) by 623 days.

(21) Appl. No.: 16/930,356

(22) Filed: Jul. 16, 2020

(65) Prior Publication Data

US 2021/0081783 A1   Mar. 18, 2021

(30) Foreign Application Priority Data

Sep. 13, 2019   (JP) .................................. 2019-167608

(51) Int. Cl.
*H03M 7/30* (2006.01)
*G06N 3/04* (2023.01)
(Continued)

(52) U.S. Cl.
CPC ............ *H03M 7/3059* (2013.01); *G06N 3/04* (2013.01); *G06N 3/08* (2013.01); *G06F 18/21* (2023.01)

(58) Field of Classification Search
CPC ........ H03M 7/3059; H03M 7/70; G06N 3/04; G06N 3/08; G06N 3/045; G06N 3/063; G06N 3/084; G06N 3/047; G06F 18/21
See application file for complete search history.

(56) References Cited

U.S. PATENT DOCUMENTS

2019/0042948 A1   2/2019 Lee et al.
2019/0122100 A1   4/2019 Kang et al.
(Continued)

FOREIGN PATENT DOCUMENTS

EP        3575952 A1   12/2019
JP     2018-124681 A    8/2018
(Continued)

OTHER PUBLICATIONS

Wen et al., TernGrad: Ternary Gradients to Reduce Communication in Distributed Deep Learning, Advances in neural information processing systems 30 (2017), 1-11 (Year: 2011).*

(Continued)

*Primary Examiner* — Ann J Lo
*Assistant Examiner* — Van C Mang
(74) *Attorney, Agent, or Firm* — Fujitsu Patent Center

(57) ABSTRACT

An information processing apparatus includes: a memory configured to store program instructions to perform quantization on quantization target data; and a processor configured to execute the program instructions stored in the memory, the program instructions including: obtaining a distribution of appearance frequencies of a plurality of variable elements included in the quantization target data; and aligning a most significant bit position of a quantization position to a variable element smaller than a variable element of a maximum value among the plurality of variable elements based on the distribution of the appearance frequencies of the plurality of variable elements.

6 Claims, 9 Drawing Sheets

(51) Int. Cl.
*G06N 3/08* (2023.01)
*G06F 18/21* (2023.01)

(56) References Cited

U.S. PATENT DOCUMENTS

2019/0171927 A1  6/2019  Diril et al.
2019/0339939 A1  11/2019  Ito et al.

FOREIGN PATENT DOCUMENTS

| JP | 2019-032833 A | 2/2019 |
|---|---|---|
| JP | 2019-079531 A | 5/2019 |
| WO | 2018/139266 A1 | 8/2018 |

OTHER PUBLICATIONS

Chakar et al., A Fast Color Quantization Using a Matrix of Local Pallets, IEEE (2000), 136-140 (Year: 2000).*
Lee et al., Wide Neural Networks of Any Depth Evolve as Linear Models Under Gradient Descent, arXiv:1902.06720v3 (2019), 1-28 (Year: 2019).*
Chang et al., New Adaptive Color Quantization Method Based on Self-Organizing Maps, IEEE Transactions on Neural Networks, vol. 16, No. 1 (2005), 237-249 (Year: 2005).*
Yuan et al., Unlabeled Data Driven Channel-Wise Bit-Width Allocation and Quantization Refinement, ICONIP 2019 Proceesings, Australian Journal of Intelligent Information Processing Systems vol. 16, No. 4, (2019), 9-16 (Year: 2019).*
Kim et al., A New Channel Quantization Strategy for MIMO Interference Alignment with Limited Feedback, IEEE Transactions on Wireless Communications, vol. 11, No. 1 (2012), 358-366 (Year: 2012).*
Xi Chen, "FxpNet: Training a Deep Convolutional Neural Network in Fixed-Point Representation", IEEE, 2017 (Year: 2017).*
Wen, Wei et al., "TernGrad: Ternary Gradients to Reduce Communication in Distributed Deep Learning", Arxiv.org, Cornell University Library, 201 Olin Library Cornell University Ithaca, NY 14853, May 22, 2017, pp. 1-13, XP080972784.
Alistarh, Dan et al.,"QSGD: Communication-Efficient SGD via Gradient Quantization and Encoding", Dec. 6, 2017, pp. 1-28, XP055684142, Retrieved from the Internet: URL: https://arxiv.org/pdf/1610.02132.pdf [retrieved on Apr. 8, 2020].
Jacob, Benoit et al.,"Quantization and Training of Neural Networks for Efficient Integer-Arithmetic-Only Inference", Eye In-Painting With Exemplar Generative Adversarial Networks, Dec. 15, 2017, 14 pages, XP055599888.
Extended European Search Report dated Jan. 14, 2021 for corresponding European Patent Application No. 20186055.8, 11 pages.
Japanese Office Action dated May 16, 2023 for corresponding Japanese Patent Application No. 2019-167608, with English Translation, 6 pages. *Please note NPL "WEN, Wei et al. TernGrad: Ternary Gradients to Reduce Communication in Distributed Deep Learning" cited herewith, was previously cited in an IDS file on Jan. 19, 2021.*
European Patent Office Action dated Aug. 14, 2023 for corresponding European Patent Application No. 20186055.8, 6 pages.

* cited by examiner ns and combi-
INFORMATION PROCESSING APPARATUS, METHOD OF PROCESSING INFORMATION, AND NON-TRANSITORY COMPUTER-READABLE STORAGE MEDIUM FOR STORING INFORMATION PROCESSING PROGRAM

CROSS-REFERENCE TO RELATED APPLICATION

This application is based upon and claims the benefit of priority of the prior Japanese Patent Application No. 2019-167608, filed on Sep. 13, 2019, the entire contents of which are incorporated herein by reference.

FIELD

The embodiment discussed herein is related to an information processing apparatus, a method of processing information, and a non-transitory computer-readable storage medium storing an information processing program.

BACKGROUND

Neural networks refer to computer scientific architectures that model biological brains. Today, with the development of neural network technology, researches into analyzation of input data and extraction of effective information using neural networks are actively conducted in various electronic systems.

Processing apparatuses for neural networks use a large amount of computation on complex input data.

Neural networks that yield remarkable results in image processing or the like realize high performance by complicating computation processing thereof. The computation processing of such a neural network also tends to be complicated. Due to such complication of the computation processing, the number of times of computations in a computer and desired memory capacity for the neural network increase.

As a method of reducing execution time of the neural network that tends to be complicated, a method of quantizing variables used in the neural network such as a weight and a gradient into fixed points is known.

Examples of the related art include Japanese Laid-open Patent Publication Nos. 2018-124681, 2019-32833, and 2019-79531.

SUMMARY

According to an aspect of the embodiments, an information processing apparatus includes: a memory configured to store program instructions to perform quantization on quantization target data; and a processor configured to execute the program instructions stored in the memory, the program instructions including: obtaining a distribution of appearance frequencies of a plurality of variable elements included in the quantization target data; and aligning a most significant bit position of a quantization position to a variable element smaller than a variable element of a maximum value among the plurality of variable elements based on the distribution of the appearance frequencies of the plurality of variable elements.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT(S)

However, there is a circumstance in that recognition accuracy for an image or the like may be degraded more in the case where learning performed in a neural network quantized by such a related-art method than in the case where learning performed in a neural network not quantized. In this disclosure, it is noted that the term of "learning" may be referred to as "training".

In an aspect of embodiments, provided is a solution to improve recognition accuracy in the case where learning is performed in a quantized neural network.

Hereinafter, an embodiment of an information processing apparatus, a method of processing information, and an information processing program will be described with reference to the drawings. The embodiment described hereinafter is merely exemplary and is not intended to exclude various modifications or technical applications that are not explicitly described in the embodiment. For example, the present embodiment may be implemented with various modifications without departing from the gist of the present embodiment. The drawings are not intended to illustrate that only the drawn elements are provided, but the embodiment may include other functions and so on.

(A) Configuration

Figure 1:
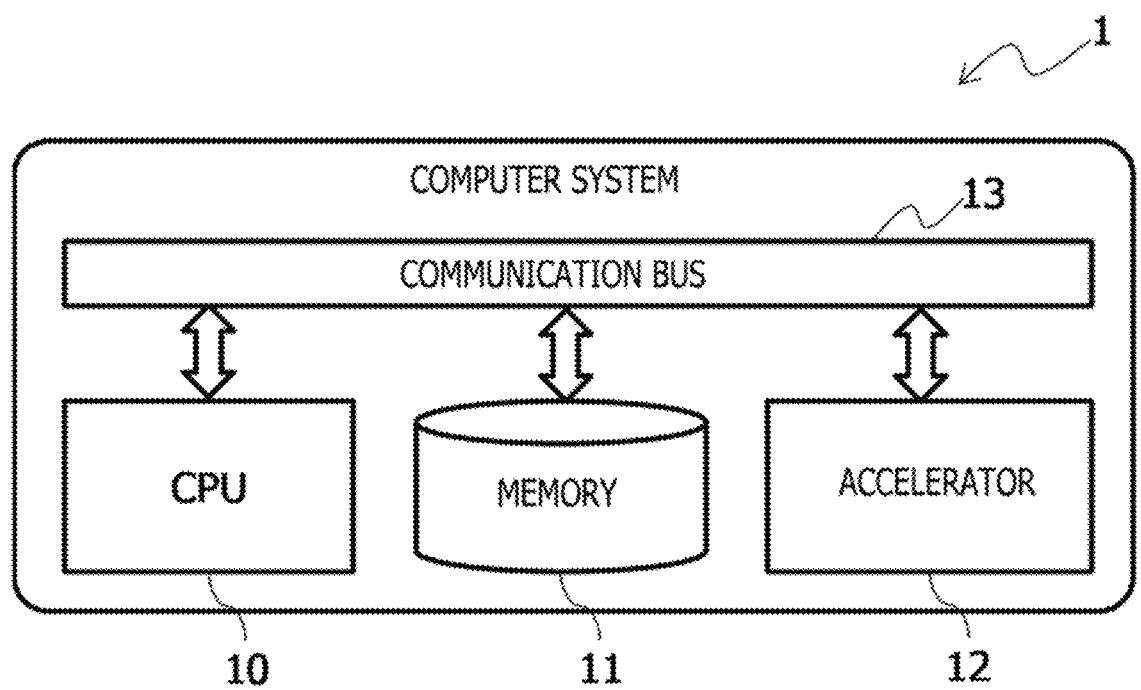
FIG. 1 is a diagram exemplifying a hardware configuration of a computer system as an example of the embodiment.

FIG. 1 is a diagram exemplifying a hardware configuration of a computer system 1 as an example of the embodiment.

The computer system 1 is an information processing apparatus and realizes a neural network quantized to a fixed point. As illustrated in FIG. 1, the computer system 1 includes a central processing unit (CPU) 10, a memory 11, and an accelerator 12. The CPU 10, the memory 11, and the accelerator 12 are communicably coupled to each other through a communication bus 13. Data communication in the computer system 1 is performed through the communication bus 13.

The memory 11 is a storage memory including a read-only memory (ROM) and a random-access memory (RAM). In the ROM of the memory 11, a software program related to quantization processing and data for this program are written. The software program on the memory 11 is appropriately read and executed by the CPU 10. The RAM of the memory 11 is used as a primary storage memory or a working memory. The RAM of the memory 11 stores the weight and other parameters used for quantization.

The accelerator 12 executes computation processing used for calculation of the neural network such as matrix computation.

The CPU 10 is a processing device (processor) that performs various controls and computations. The CPU 10 controls the entire computer system 1 based on implemented programs. The CPU 10 executes a deep learning processing program (not illustrated) stored in the memory 11 or the like, thereby realizing a function as a deep learning processing unit 100, which will be described later.

The deep learning processing program may include a quantization processing program. The CPU 10 executes the quantization processing program (not illustrated) stored in the memory 11 or the like, thereby realizing a function as a quantization processing unit 101, which will be described later.

The CPU 10 of the computer system 1 executes the deep learning processing program (quantization processing program, information processing program), thereby functioning as the deep learning processing unit 100 (quantization processing unit 101).

The program (deep learning processing program, quantization processing program), which realizes the function as the deep learning processing unit 100 (quantization processing unit 101, information processing program), is provided in a form of being recorded in a computer readable recording medium such as, for example, a flexible disk, a compact disk (a CD such as a CD-ROM, a CD-recordable (R), or a CD-rewritable (RW)), a digital video disk (a DVD such as a DVD-ROM, a DVD-RAM, a DVD-R, a DVD+R, a DVD-RW, a DVD+RW, or high-definition (HD) DVD), a Blu-ray disk, a magnetic disk, an optical disk, or a magneto-optical disk. A computer (computer system 1) uses the program by reading from the recording medium the program having been transferred to and stored in an internal storage device or an external storage device. For example, the program may be recorded in a storage device (recording medium) such as a magnetic disk, an optical disk, or a magneto-optical disk and provided from the storage device to the computer through a communication path.

When the function as the deep learning processing unit 100 (quantization processing unit 101) is realized, a program stored in the internal storage device (the RAM or the ROM of the memory 11 according to the present embodiment) is executed by a microprocessor (CPU 10 according to the present embodiment) of the computer. At this time, the computer may read and execute the program recorded in the recording medium.

Figure 2:
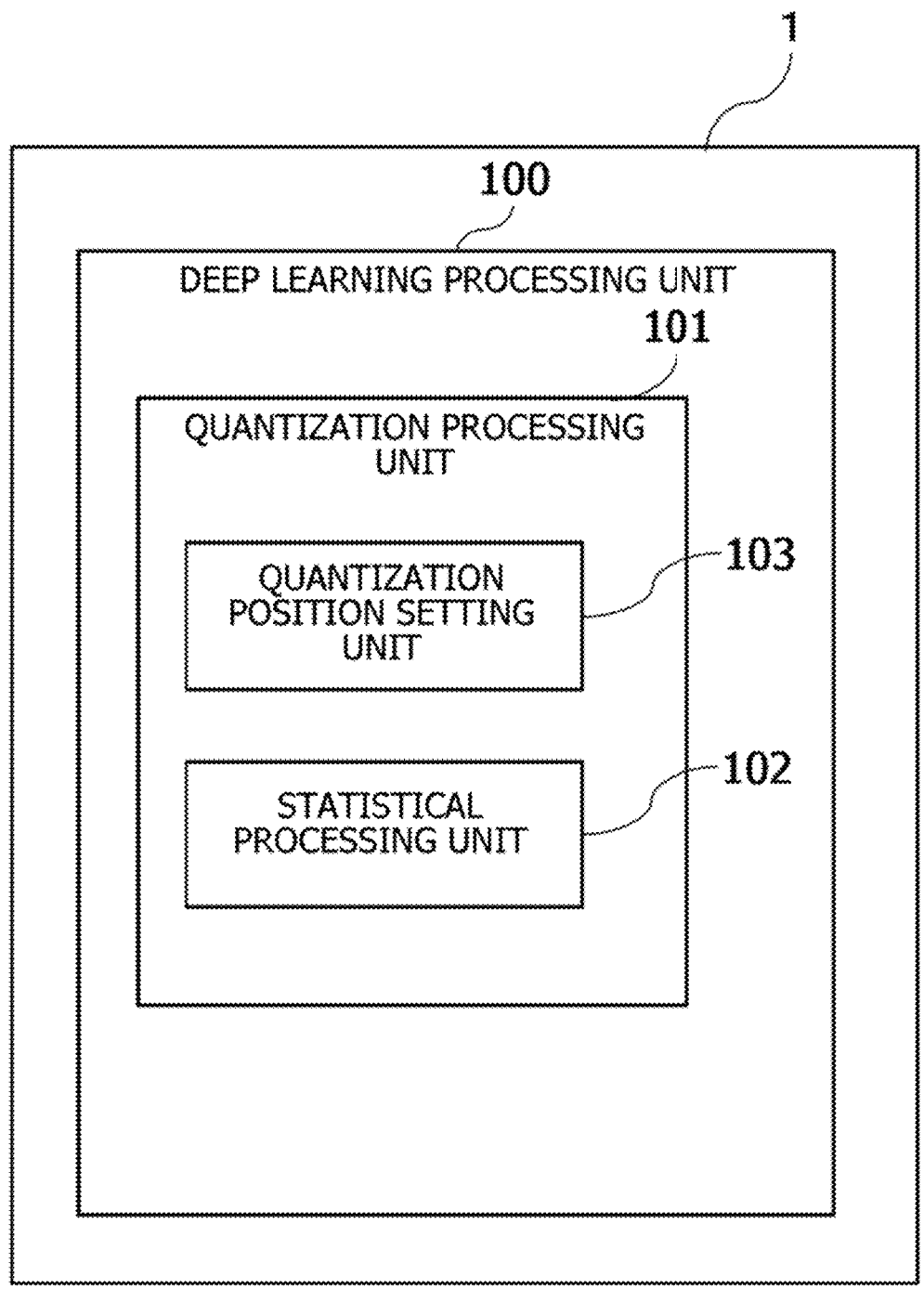
FIG. 2 is a diagram exemplifying a functional configuration of the computer system as the example of the embodiment.

FIG. 2 is a diagram exemplifying a functional configuration of the computer system 1 as the example of the embodiment.

As illustrated in FIG. 2, the computer system 1 has a function as the deep learning processing unit 100. The deep learning processing unit 100 performs deep learning in the neural network.

The neural network may be a hardware circuit or a virtual network by software that couples layers virtually built in a computer program by the CPU 10 or the like.

Figure 3:
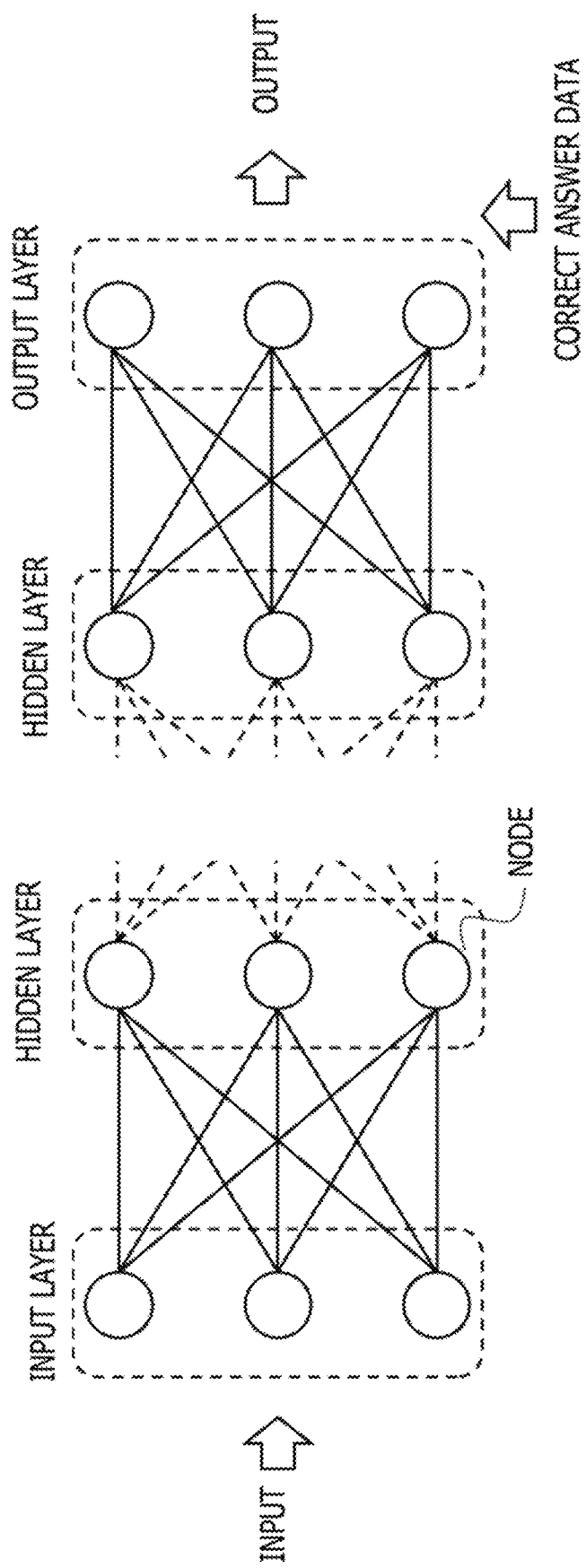
FIG. 3 illustrates an outline of a neural network.

FIG. 3 illustrates an outline of the neural network. The neural network illustrated in FIG. 3 is a deep neural network including a plurality of hidden layers between an input layer and an output layer. Examples of the hidden layers include, for example, a convolution layer, a pooling layer, a fully connected layer, and the like. Circles illustrated in the layers indicate nodes that perform respective predetermined calculations.

For example, the neural network inputs input data such as an image or a sound to the input layer and sequentially performs the predetermined calculations in the hidden layers including the convolution layer, the pooling layer, and the like, thereby performing processing in a forward direction (forward propagation processing) in which information obtained by computation is sequentially transmitted from the input side to the output side. After the processing in the forward direction has been executed, processing in a backward direction (back propagation processing) that determines parameters used in the processing in the forward direction is executed for reducing a value of an error function obtained from correct answer data and output data output from the output layer. Then, update processing that updates variables, for example, the weight, is executed based on the result of the back propagation processing. For example, as an algorithm for determining an update width of the weight to be used in the calculations in the back propagation processing, gradient descent is used.

A weight update expression is represented as expression (1) below:

$$W_{t+1} \leftarrow W_t - \eta \cdot \Delta w \quad (1)$$

where $W_{t+1}$ is the weight after the update, $W_t$ is the weight before the update, $\eta$ is the learning rate of the neural network, and $\Delta w$ is the gradient.

The deep learning processing unit 100 includes the quantization processing unit 101.

The quantization processing unit 101 quantizes variables used in the neural network. For example, the quantization processing unit 101 quantizes the above-described gradient $\Delta w$.

The quantization processing unit 101 has functions of changing a data type representing a variable in performing quantization. The quantization processing unit 101 may convert a floating-point type variable into a fixed-point type variable.

For example, the quantization processing unit 101 may change, for example, a 32-bit floating-point number to an 8-bit fixed-point number.

In this computer system 1, the quantization processing unit 101 has the functions of a statistical processing unit 102 and a quantization position setting unit 103.

The statistical processing unit 102 obtains statistical information on a distribution of bits of quantization target data. For example, the statistical processing unit 102 counts an appearance frequency of the value of the gradient $\Delta w$ which is a quantization target. The statistical processing unit 102 counts the appearance frequency of the value of the gradient $\Delta w$ in the fixed point.

The statistical processing unit 102 obtains a distribution of the appearance frequencies of a plurality of variable elements included in quantization target data. The distribution of the appearance frequencies of the variable elements included in the quantization target data may be obtained by a known method, and description thereof is omitted.

The quantization position setting unit 103 sets a quantization position.

Figure 4:
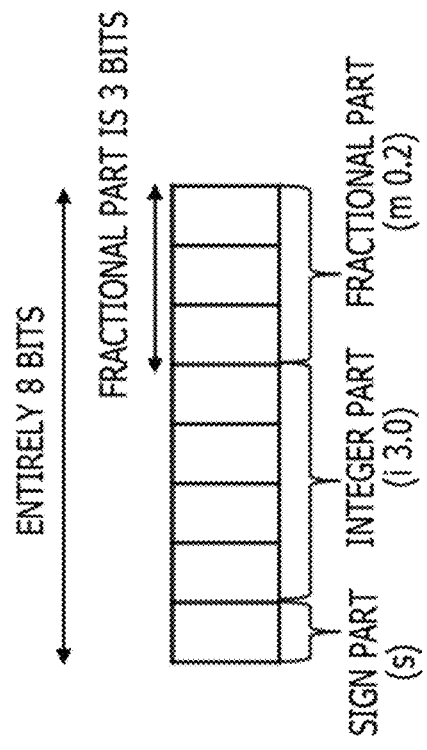
FIG. 4 is a diagram explaining a fixed-point numerical value.

FIG. 4 is a diagram explaining a fixed-point numerical value.

FIG. 4 exemplifies a configuration of a fixed point <8,3> in which the bit width is 8 bits and a decimal point bit width is 3 bits.

The fixed point <8,3> exemplified in FIG. 4 is represented by the following expression (2).

$$F=(-1)^4 s \times (i_3 \times 2^6 + i_2 \times 2^5 + i_1 + 2^4 + i_0 \times 2^3 + m_0 \times 2^2 + m_1 \times 2^1 + m_2 + 2^0) \times 2^{\wedge}(-3) \quad (2)$$

In the above expression (2), "−3", which is the exponent part of "2^(−3)" at the end, corresponds to the decimal point bit width and indicates the resolution of quantization. This "−3" determined by the decimal point bit width corresponds to the quantization position. The quantization position may also be referred to as a quantization range.

Figure 5:
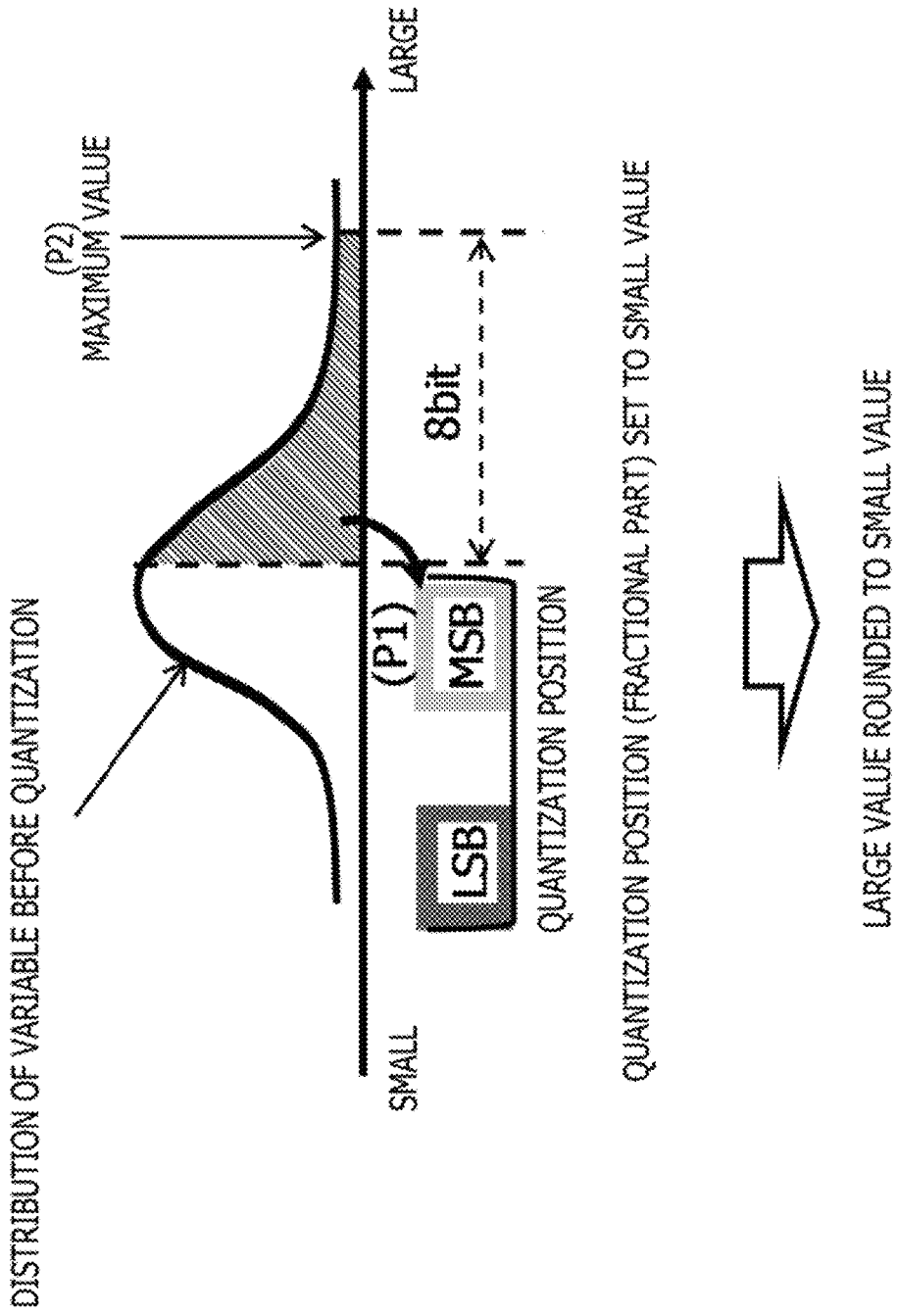
FIG. 5 is a diagram explaining a quantization position in the computer system as the example of the embodiment.

FIG. 5 is a diagram explaining the quantization position in the computer system 1 as an example of the embodiment. FIG. 5 represents the distribution of a variable before quantization with a line graph. In the distribution diagram exemplified in FIG. 5, the horizontal axis represents quantization target variable elements (logarithmic values with a base of 2), and the right side in the diagram represents a high-order bit position (a large value). For example, FIG. 5 illustrates the distribution of the appearance frequencies of the variable elements included in the quantization target data. In FIG. 5, the horizontal axis represents the variable elements (logarithmic values with a base of 2) of the gradient Δw that are the quantization targets. The vertical axis represents the appearance frequency (frequency).

When a learning rate η is smaller than a predetermined threshold T, the quantization position setting unit 103 aligns (sets) a quantization range for the gradient Δw to such a value that the most significant bit (MSB) of the quantization range is smaller than a maximum value (quantization maximum value) in the distribution of variable elements before quantization. The threshold T of the learning rate η may be set in advance by, for example, a system administrator and stored in advance in a predetermined storage area of the memory 11.

In the example illustrated in FIG. 5, the quantization position setting unit 103 sets (shifts) the quantization range such that the MSB of the quantization range (see reference sign P1 in FIG. 5) is a smaller value by 8 bits than the maximum value (quantization maximum value: see reference sign P2 in FIG. 5) in the distribution of the variable elements before the quantization.

In the distribution of variable elements before the quantization illustrated in FIG. 5, a region further to the right side than the quantization position (hatched region in FIG. 5) indicates a value out of the quantization range (outside the quantization range). The quantization position setting unit 103 sets the quantization position such that a value out of the quantization range becomes an MSB position after the quantization.

When the quantization position setting unit 103 sets the quantization position as described above, at least one value having the MSB as the top among the variable elements before the quantization falls outside the quantization range by the quantization performed by the quantization processing unit 101. For example, one or more values counted from the largest variable element among the variable elements before the quantization fall outside the quantization range.

The amount of the shift of the quantization position relative to the distribution of the variable elements before the quantization may be appropriately changed. This shift amount of the quantization position is stored in advance in a predetermined storage area of the memory 11 or the like.

For example, the variable elements outside the quantization range may be rounded off by performing half adjust, so that a subset of the variable elements is included in the quantization range. As a result, large values among the variable elements before the quantization are rounded to values in the quantization range.

The quantization position setting unit 103 may set the fractional part of the variables in the neural network other than Δw (for example, a gradient not used for the weight, an activity, or updating the weight) such that the maximum value of the values before the quantization is the MSB of the quantization position.

Here, the quantization position in a quantization method of related art is described.

Figure 6:
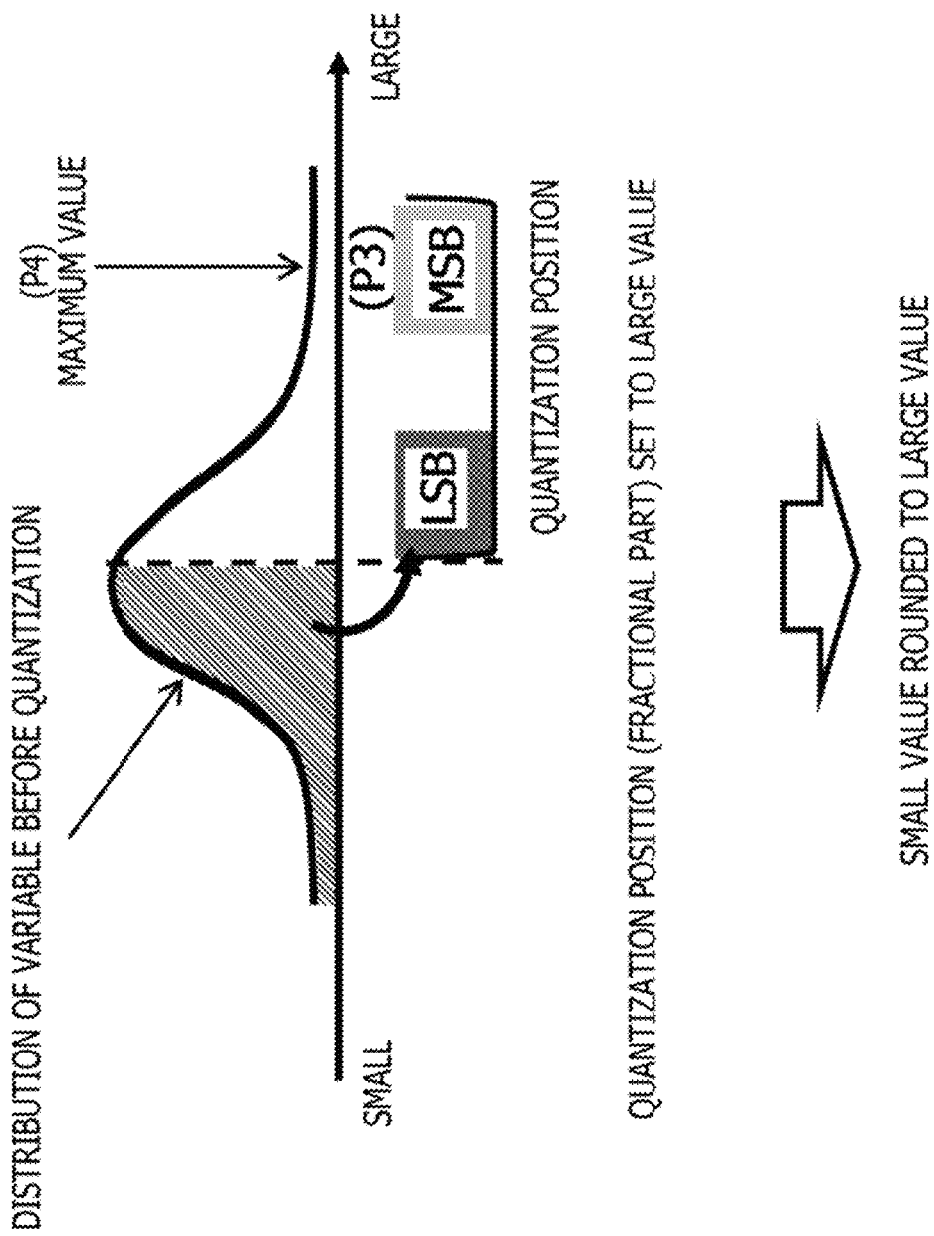
FIG. 6 is a diagram explaining a quantization position in a computer system of related art.

FIG. 6 is a diagram explaining a quantization position in a computer system of related art. FIG. 6 represents a distribution of a variable before the quantization with a line graph. In the distribution diagram exemplified in FIG. 6, the horizontal axis represents quantization target variable elements (logarithmic values with a base of 2), and the right side in the diagram represents a high-order bit position (a large value). For example, in FIG. 6, the horizontal axis represents the variable elements (logarithmic values with a base of 2) of the gradient Δw that are the quantization targets. The vertical axis represents the appearance frequency (frequency).

In the quantization method of related art, the quantization range is such that the MSB of the quantization range is aligned (set) to the MSB in the distribution of the variable elements before the quantization.

In the example illustrated in FIG. 6, the quantization range is set such that the MSB of the quantization range (see reference sign P3 in FIG. 6) is the maximum value (quantization maximum value: see reference sign P4 in FIG. 6) in the distribution of the variable elements before the quantization.

As a result, by performing the quantization, at least one value from the smallest value among the variable elements before the quantization falls outside the quantization range. For example, one or more values counted from the smallest variable element among the variable elements before the quantization fall outside the quantization range.

For example, the variable elements outside the quantization range may be rounded off by performing half adjust, so that a subset of the variable elements is included in the quantization range. As a result, small values among the variable elements before the quantization are rounded to values in the quantization range.

(B) Operation

Figure 7:
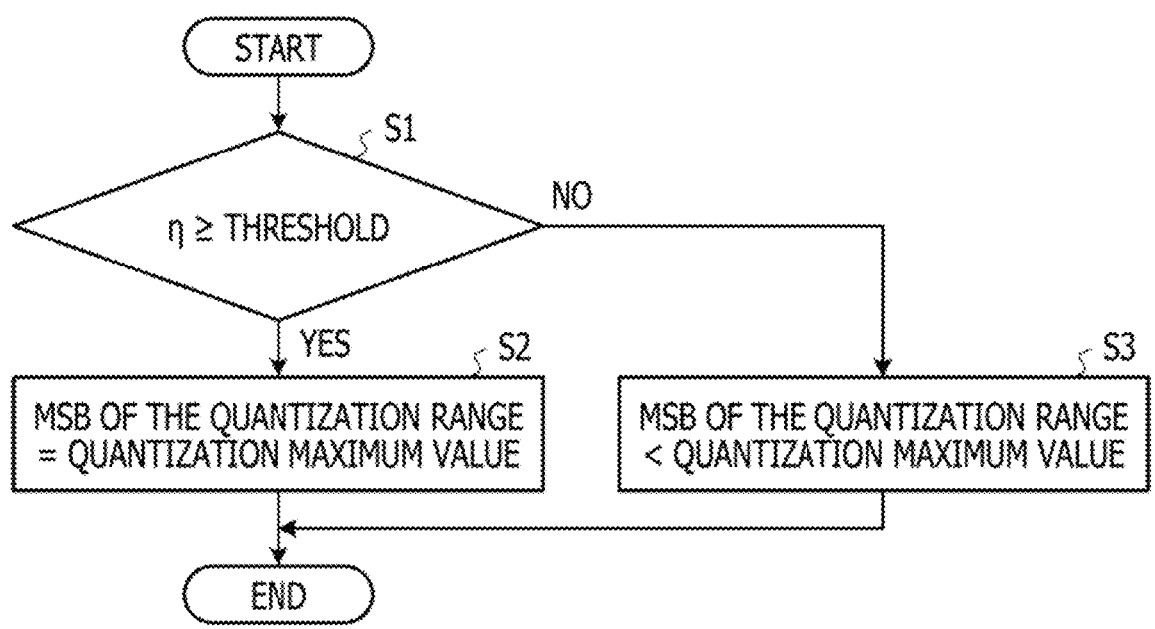
FIG. 7 is a flowchart explaining processing performed by a quantization position setting unit of the computer system as the example of the embodiment.

Processing performed by the quantization position setting unit 103 of the computer system 1 as the example of the embodiment configured as above is described with reference to a flowchart illustrated in FIG. 7 (following steps S1 to S3). The following processing is performed when the quantization processing unit 101 quantizes the gradient Δw to a fixed point.

At time of learning (i.e., training) of the neural network, for example, when the weight is updated, the quantization position setting unit 103 checks whether the learning rate r is larger than or equal to the predetermined threshold T (step S1).

As a result of the check, when the learning rate η is larger than or equal to the predetermined threshold T (see YES route of step S1), the quantization position setting unit 103 sets the quantization range such that the MSB of the quantization range is coincident with the quantization maximum value (step S2).

In contrast, when the learning rate η is smaller than the predetermined threshold T as a result of the check in step S1 (see NO route of step S1), the quantization position setting unit 103 sets the quantization range such that the MSB of the quantization range is smaller than the quantization maximum value (step S3).

After that, the quantization processing unit 101 performs the quantization on the quantization position set by the quantization position setting unit 103. The quantization processing by the quantization processing unit 101 may be realized by a known method, and a description thereof is omitted.

(C) Effects

As described above, with the computer system 1 as the example of the embodiment, the quantization position setting unit 103 aligns the MSB position of the quantization position to a variable element smaller than a variable element of the maximum value in the distribution of the appearance frequencies of the variable elements included in the quantization target data. Accordingly, even when learning (i.e., training) is performed with the neural network quantized, the amount of degradation in recognition rate for an image or the like is reduced compared to the case where the neural network is not quantized.

Figure 8:
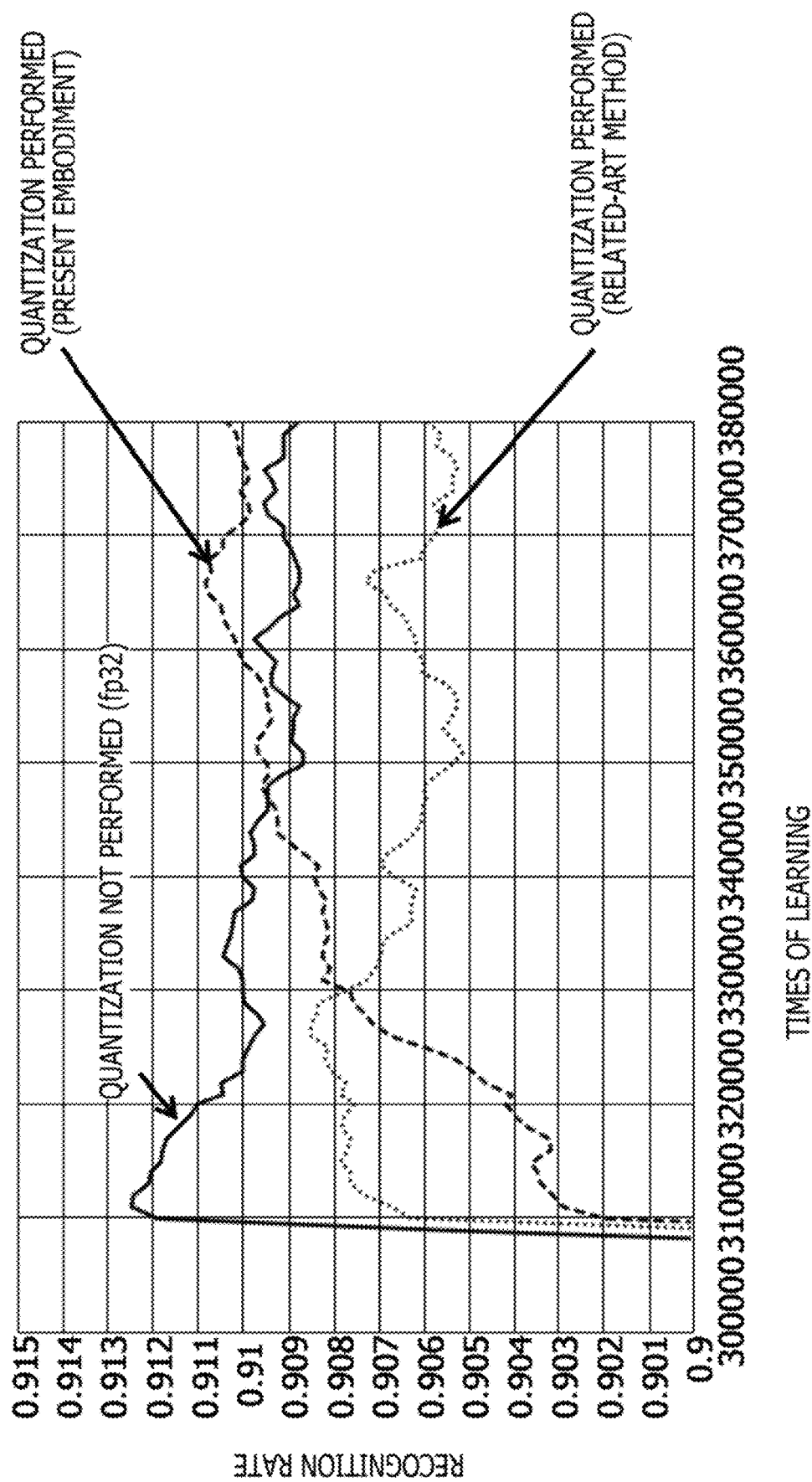
FIG. 8 is a diagram exemplifying an image recognition rate by a quantization method of the computer system as the example of the embodiment.

FIG. 8 is a diagram exemplifying the image recognition rate by the quantization method of the computer system 1 as the example of the embodiment.

In FIG. 8, the learning results (recognition rates) in the case where the quantization is not performed (fp32), in the case where the quantization is performed by the method of related art, and in the case where the quantization is performed by the quantization method of the computer system 1 are illustrated.

Here, the method of related art sets the quantization range such that the MSB of the quantization range coincides with the quantization maximum value, and the quantization method of the computer system 1 sets the quantization range such that the MSB of the quantization range is smaller than the quantization maximum value. For example, in the comparison result exemplified in FIG. 8, the case where the quantization is performed (present invention) indicates the case where the quantization position is set such that the MSB of the quantization position is a value smaller than the quantization maximum value by 8 bits.

As illustrated in FIG. 8, the recognition rate in the case where the quantization is performed by the method of related art is significantly reduced compared to the recognition rate in the case where the quantization is not performed. In contrast, in the quantization method of this computer system 1, the recognition rate is equivalent to the recognition rate in the case where the quantization is not performed.

For example, with the computer system 1, even when learning (i.e., training) is performed with the neural network quantized, the recognition rate may be made equal to the recognition rate in the case where the neural network is not quantized. Thus, the reliability may be improved.

Figure 9:
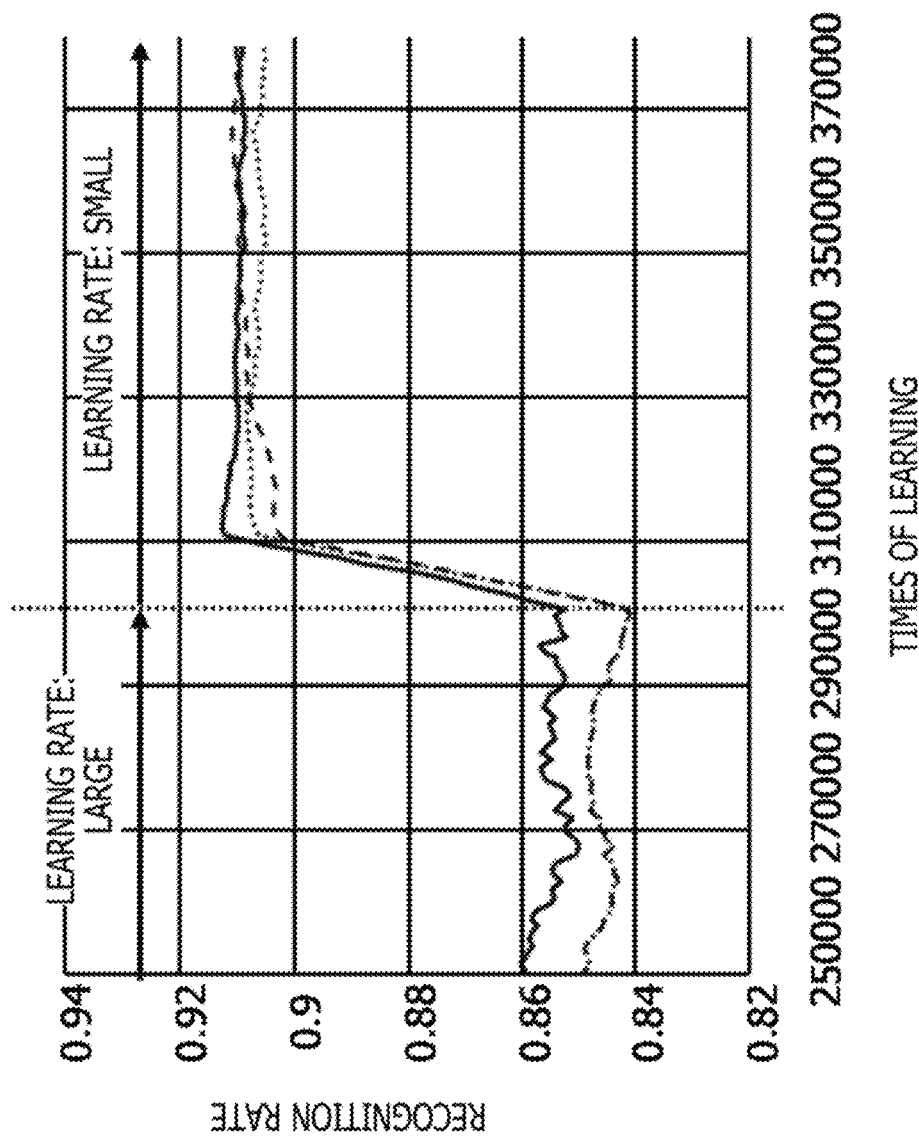
FIG. 9 is a diagram explaining the image recognition rate by the quantization method of the computer system as the example of the embodiment.

FIG. 9 is a diagram explaining the image recognition rate by the quantization method of the computer system 1 as the example of the embodiment.

FIG. 9 indicates the recognition rate in the case where the learning rate is high and the recognition rate in the case where the learning rate is low. In the case where the learning rate is high, a state where the learning rate is larger than the above-described threshold T is included, and a case where the learning rate is low, a state where the learning rate is larger than or equal to the above-described threshold T is included.

When the learning rate is smaller than the threshold T, the computer system 1 reduces the fractional part of Δw (see the right side in FIG. 9). For example, the quantization range is set such that the MSB of the quantization range is smaller than the quantization maximum value. As a result, in the case where the learning rate is low, a recognition rate equivalent to the recognition rate in the case where the quantization is not performed may be obtained.

When the learning rate is larger than the threshold T, the computer system 1 reduces the fractional part of Δw (see the left side in FIG. 9). For example, when the learning rate is high, the quantization range is set such that the MSB of the quantization range coincides with the quantization maximum value. In this way, the recognition rate is equivalent to the recognition rate of the method of related art.

(D) Others

The disclosed technique is not limited to the above-described embodiment but may be carried out with various modifications without departing from the gist of the present embodiment. The configurations and types of processing of the present embodiment may be selected as desired or may be combined as appropriate.

In the above-described embodiment, the functions of the quantization processing unit 101 (quantization position setting unit 103, statistical processing unit 102) are realized when the CPU 10 executes the program. However, this is not limiting. At least a subset of the functions of the quantization processing unit 101 (quantization position setting unit 103, statistical processing unit 102) may be realized by an electronic circuit or may be implemented with various modifications.

In the above-described embodiment, the quantization position setting unit 103 sets the quantization range such that the value of the MSB of the quantization range is smaller than the quantization maximum value at the timing when the fact that the learning rate η is smaller than the threshold T is detected. However, this is not limiting. The quantization position setting unit 103 may position the quantization range at a slightly delayed timing (for example, one or two epochs later) after the fact that the learning rate n is smaller than the threshold T has been detected. This may produce an effect of improving the learning speed.

According to the above-described embodiment, the example has been described in which the quantization processing unit 101 performs the quantization of the gradient w of the weight used for computation in the forward direction. However, this is not limiting, and the quantization processing unit 101 may be implemented with various modifications. For example, the quantization processing unit 101 may be applied to the quantization of the gradient used for computation in the backward direction. This may produce an effect of facilitating the implementation.

In the above-described embodiment, the example has been described in which the neural network is used for image recognition. However, this is not limiting, and the technique described according to the embodiment may be implemented with appropriate modifications.

With the above disclosure, those skilled in the art is able to implement and manufacture the present embodiment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing apparatus of performing quantization processing on quantization target data using a fixed-point type variable, the information processing apparatus comprising:

an accelerator circuit configured to execute calculation of a neural network; and a quantization processing circuit coupled to the accelerator circuit, the quantization processing circuit including:

a statistical processing circuit configured to obtain a distribution of appearance frequencies of a plurality of variable elements included in the quantization target data, each of the plurality of variable elements being a floating-point type variable; and a quantization position setting circuit configured to:

align a most significant bit (MSB) position of a quantization position to be used for conversion from the floating-point type variable to a fixed-point type variable, to a variable element smaller than a variable element of a maximum value among the plurality of variable elements based on the distribution of the appearance frequencies of the plurality of variable elements, the aligning of the quantization position including: adjusting at least the maximum value among the plurality of variable elements to fall outside the quantization position, and adjusting the minimum value among the plurality of variable elements to fall inside the quantization position; and convert, for each variable element of the plurality of variable elements, the variable element into a respective fixed-point type variable by using the aligned quantization position, to perform machine-learning by causing the accelerator circuit to execute the calculation of the neural network using the respective fixed-point type variable converted from the variable element.

2. The information processing apparatus according to claim 1, wherein the aligning is performed by the quantization position setting circuit such that a value outside a quantization range becomes the most significant bit position after the quantization.

3. The information processing apparatus according claim 1, wherein the quantization target data is a gradient used for updating a weight of a neural network.

4. The information processing apparatus according to claim 1, wherein, in response to detecting that a learning rate of a neural network is smaller than a predetermined threshold, the aligning is performed by the quantization position setting circuit.

5. A quantization method implemented by a computer including an accelerator circuit and a quantization processing circuit of performing quantization processing on quantization target data using a fixed-point type variable, the quantization method comprising:

obtaining, by a statistical processing circuit included in the quantization processing circuit, a distribution of appearance frequencies of a plurality of variable elements included in the quantization target data, each of the plurality of variable elements being a floating-point type variable;

aligning, by a quantization position setting circuit included in the quantization processing circuit, a most significant bit (MSB) position of a quantization position to be used for conversion from the floating-point type variable to a fixed-point type variable, to a variable element smaller than a variable element of a maximum value among the plurality of variable elements based on the distribution of the appearance frequencies of the plurality of variable elements, the aligning of the quantization position including: adjusting at least the maximum value among the plurality of variable elements to fall outside the quantization position, and adjusting the minimum value among the plurality of variable elements to fall inside the quantization position; and converting, by the quantization position setting circuit included in the quantization processing circuit, for each variable element of the plurality of variable elements, the variable element into a respective fixed-point type variable by using the aligned quantization position, to perform machine-learning by causing the accelerator circuit to execute a calculation of a neural network using the respective fixed-point type variable converted from the variable element.

6. A non-transitory computer-readable storage medium for storing an information processing program which causes a computer to perform processing of performing quantization processing on quantization target data using a fixed-point type variable, the computer including a processor circuit and an accelerator circuit configured to execute calculation of a neural network, the processing comprising:

obtaining, in the processor circuit of the computer, a distribution of appearance frequencies of a plurality of variable elements included in the quantization target data, each of the plurality of variable elements being a floating-point type variable;

aligning, in the processor circuit of the computer, a most significant bit (MSB) position of a quantization position to be used for conversion from the floating-point type variable to a fixed-point type variable, to a variable element smaller than a variable element of a maximum value among the plurality of variable elements based on the distribution of the appearance frequencies of the plurality of variable elements, the aligning of the quantization position including: adjusting at least the maximum value among the plurality of variable elements to fall outside the quantization position, and adjusting the minimum value among the plurality of variable elements to fall inside the quantization position; and converting, in the processor circuit of the computer, for each variable element of the plurality of variable elements, the variable element into a respective fixed-point type variable by using the aligned quantization position, to perform machine-learning by causing the accelerator circuit to execute the calculation of the neural network using the respective fixed-point type variable converted from the variable element.

* * * * *